United States Patent
Pinnington

(10) Patent No.: US 10,868,212 B2
(45) Date of Patent: Dec. 15, 2020

(54) EPITAXIAL FORMATION STRUCTURES AND ASSOCIATED METHODS OF MANUFACTURING SOLID STATE LIGHTING DEVICES

(71) Applicant: Micron Technology, Inc., Boise, ID (US)

(72) Inventor: Thomas Pinnington, Somerville, MA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/077,548

(22) Filed: Nov. 12, 2013

(65) Prior Publication Data

US 2014/0070166 A1    Mar. 13, 2014

Related U.S. Application Data

(62) Division of application No. 12/878,815, filed on Sep. 9, 2010, now Pat. No. 8,580,593.

(Continued)

(51) Int. Cl.
*H01L 21/00* (2006.01)
*H01L 33/04* (2010.01)
(Continued)

(52) U.S. Cl.
CPC ........ *H01L 33/04* (2013.01); *H01L 21/76254* (2013.01); *H01L 33/007* (2013.01); *H01L 33/0093* (2020.05); *H01L 33/12* (2013.01)

(58) Field of Classification Search
CPC ............. H01L 21/76254; H01L 33/007; H01L 33/0079; H01L 33/04; H01L 33/12
(Continued)

(56) References Cited

U.S. PATENT DOCUMENTS 3,165,864 A * 1/1965 Shulze .................... B32B 18/00
                                                                165/9.1
4,126,652 A * 11/1978 Oohara .................. B82Y 30/00
                                                                264/182
(Continued)

FOREIGN PATENT DOCUMENTS

CN       1443374 A       9/2003
CN       1476050 A       2/2004
(Continued)

OTHER PUBLICATIONS

George, "Studies of Ultra High Temperature Ceramic Composite Components: Synthesis and Characterization of HfOxCy and Si Oxidation in Atomic Oxygen Containing Environments", PhD Thesis for Graduate School of Vanderbilt University (2008).*

(Continued)

*Primary Examiner* — Jay C Kim
(74) *Attorney, Agent, or Firm* — Perkins Coie LLP

(57) ABSTRACT

Epitaxial formation structures and associated methods of manufacturing solid state lighting ("SSL") devices with target thermal expansion characteristics are disclosed herein. In one embodiment, an SSL device includes a composite structure having a composite CTE temperature dependency, a formation structure on the composite structure, and an SSL structure on the formation structure. The SSL structure has an SSL temperature dependency, and a difference between the composite CTE and SSL temperature dependencies is below 3 ppm/° C. over the temperature range.

3 Claims, 7 Drawing Sheets

Related U.S. Application Data

(60) Provisional application No. 61/241,233, filed on Sep. 10, 2009.

(51) Int. Cl.
*H01L 33/12* (2010.01)
*H01L 33/00* (2010.01)
*H01L 21/762* (2006.01)

(58) Field of Classification Search
USPC .......................................................... 438/47
See application file for complete search history.

(56) References Cited

U.S. PATENT DOCUMENTS

| | | | | |
|---|---|---|---|---|
| 4,394,170 A * | 7/1983 | Sawaoka | ................ | B01J 3/062 501/87 |
| 4,578,234 A * | 3/1986 | Huseby | ................ | C04B 35/581 264/659 |
| 4,578,364 A * | 3/1986 | Huseby | ................ | C04B 35/581 264/44 |
| 4,578,365 A * | 3/1986 | Huseby | ................ | C04B 35/581 264/44 |
| 4,591,537 A * | 5/1986 | Aldinger | ................ | C04B 35/581 174/16.3 |
| 4,686,070 A * | 8/1987 | Maguire | ................ | C01B 21/0825 264/1.21 |
| 4,705,761 A * | 11/1987 | Kosugi | ................ | C04B 35/565 501/87 |
| 4,744,943 A * | 5/1988 | Timm | ................ | B22F 3/1216 264/125 |
| 4,960,736 A * | 10/1990 | Luxzsz | ................ | C04B 35/652 156/155 |
| 5,030,597 A * | 7/1991 | Ogata | ................ | C04B 35/5611 501/102 |
| 5,041,261 A * | 8/1991 | Buljan | ................ | C22C 29/005 419/10 |
| 5,051,218 A * | 9/1991 | Matthews | ................ | B22F 3/1225 264/125 |
| 5,135,895 A * | 8/1992 | Frechette | ................ | C04B 35/62227 264/DIG. 19 |
| 5,145,833 A * | 9/1992 | Prunier, Jr. | ................ | C04B 35/4508 264/122 |
| 5,147,446 A * | 9/1992 | Pechenik | ................ | C04B 35/584 264/109 |
| 5,154,863 A * | 10/1992 | Miyahara | ................ | C04B 35/581 264/659 |
| 5,167,271 A * | 12/1992 | Lange | ................ | B22D 19/14 164/103 |
| 5,268,233 A * | 12/1993 | Heller | ................ | C04B 35/2683 428/523 |
| 5,320,990 A * | 6/1994 | Guiton | ................ | C04B 35/581 264/671 |
| 5,342,563 A * | 8/1994 | Quinn | ................ | C04B 35/111 264/681 |
| 5,563,107 A * | 10/1996 | Dubensky | ................ | C04B 35/5607 501/87 |
| 5,622,751 A * | 4/1997 | Thebault | ................ | C04B 35/806 427/376.2 |
| 5,721,062 A * | 2/1998 | Kobayashi | ................ | C04B 37/005 428/688 |
| 5,750,450 A * | 5/1998 | Bull | ................ | C04B 35/5622 501/91 |
| 5,773,377 A * | 6/1998 | Harris | ................ | C04B 35/64 428/698 |
| 5,778,301 A * | 7/1998 | Hong | ................ | C22C 1/051 419/15 |
| 5,825,848 A * | 10/1998 | Virshup | ................ | H01J 35/108 378/144 |
| 5,876,659 A * | 3/1999 | Yasutomi | ................ | C04B 35/80 164/461 |
| 5,922,628 A * | 7/1999 | Barton | ................ | C04B 37/005 156/89.28 |
| 5,934,900 A * | 8/1999 | Billings | ................ | B22C 1/00 428/469 |
| 5,989,731 A | 11/1999 | Arisawa et al. | | |
| 6,017,485 A * | 1/2000 | Enck | ................ | C04B 35/581 257/E23.009 |
| 6,019,668 A * | 2/2000 | Ramanath | ................ | B24B 1/00 451/41 |
| 6,146,457 A | 11/2000 | Solomon | | |
| 6,165,812 A * | 12/2000 | Ishibashi | ................ | C30B 25/02 117/89 |
| 6,239,402 B1 * | 5/2001 | Araki | ................ | C04B 35/581 118/725 |
| 6,299,658 B1 * | 10/2001 | Moriguchi | ................ | C22C 29/02 51/307 |
| 6,309,737 B1 * | 10/2001 | Hirashima | ................ | C04B 37/026 174/258 |
| 6,486,085 B1 * | 11/2002 | Katsuda | ................ | C04B 35/581 257/E23.009 |
| 6,497,763 B2 | 12/2002 | Kub et al. | | |
| 6,500,052 B2 * | 12/2002 | Natsuhara | ................ | B24B 7/22 451/179 |
| 6,531,423 B1 * | 3/2003 | Schwetz | ................ | C04B 35/575 501/89 |
| 6,554,179 B2 * | 4/2003 | Horner | ................ | B23K 35/005 228/121 |
| 6,703,780 B2 * | 3/2004 | Shiang | ................ | H01L 51/5262 313/504 |
| 6,717,116 B1 * | 4/2004 | Ito | ................ | H01L 21/6831 219/444.1 |
| 6,723,274 B1 * | 4/2004 | Divakar | ................ | C04B 35/581 264/618 |
| 6,800,576 B2 * | 10/2004 | Katsuda et al. | ............. | 501/98.4 |
| 6,849,938 B2 * | 2/2005 | Ito | ................ | H01L 21/67103 219/520 |
| 6,861,165 B2 * | 3/2005 | Hiramatsu | ................ | B32B 18/00 428/323 |
| 6,867,067 B2 | 3/2005 | Ghyselen et al. | | |
| 6,872,908 B2 * | 3/2005 | Ootsuka | ................ | B32B 18/00 219/121.52 |
| 6,927,426 B2 * | 8/2005 | Matsuoka | ................ | H01L 27/153 257/103 |
| 7,071,495 B2 * | 7/2006 | Uemura | ................ | 257/98 |
| 7,071,551 B2 * | 7/2006 | Hiramatsu | ................ | H01L 21/67103 257/690 |
| 7,108,925 B2 * | 9/2006 | Campbell | ................ | C04B 35/185 428/698 |
| 7,172,820 B2 * | 2/2007 | Darolia | ................ | C23C 28/3215 416/241 R |
| 7,194,066 B2 * | 3/2007 | Tiearney, Jr. | ........... | H01J 35/06 378/143 |
| 7,196,356 B2 * | 3/2007 | Ishii et al. | ................ | 257/81 |
| 7,250,215 B2 * | 7/2007 | Yoshikawa | ................ | B82Y 30/00 428/408 |
| 7,288,496 B2 * | 10/2007 | Kobayashi et al. | ......... | 501/98.4 |
| 7,294,360 B2 * | 11/2007 | Maula | ................ | C23C 16/45525 117/105 |
| 7,336,764 B2 * | 2/2008 | Reynolds | ................ | H05H 7/00 315/505 |
| 7,341,878 B2 * | 3/2008 | Krames | ................ | B82Y 30/00 438/22 |
| 7,374,821 B2 * | 5/2008 | Leclercq | ................ | C04B 35/486 428/469 |
| 7,375,045 B2 * | 5/2008 | Lee | ................ | C04B 35/581 501/98.5 |
| 7,384,443 B2 * | 6/2008 | Mirchandani | ................ | C22C 1/051 75/236 |
| 7,394,043 B2 * | 7/2008 | Kuibira | ................ | H05B 3/265 118/725 |
| 7,407,697 B2 * | 8/2008 | Nishihara | ................ | G11B 7/24038 257/E27.004 |
| 7,440,280 B2 * | 10/2008 | Shuy | ................ | F28D 15/0233 361/701 |
| 7,479,467 B2 * | 1/2009 | Komatsu et al. | ............. | 501/98.4 |
| 7,514,721 B2 * | 4/2009 | Krames | ................ | C04B 35/44 257/98 |
| 7,547,408 B1 * | 6/2009 | Sweeney et al. | ............. | 264/658 |

(56) References Cited

U.S. PATENT DOCUMENTS

| | | | | |
|---|---|---|---|---|
| 7,553,787 | B2* | 6/2009 | Yoshikawa | C04B 35/581 501/98.4 |
| 7,553,788 | B2* | 6/2009 | Kanechika | C04B 35/581 264/662 |
| 7,593,229 | B2* | 9/2009 | Shuy | F21K 9/00 361/705 |
| 7,628,878 | B2* | 12/2009 | Riedell | B64G 1/58 156/89.11 |
| 7,662,736 | B2* | 2/2010 | Komatsu | C04B 35/62675 501/98.4 |
| 7,791,096 | B2* | 9/2010 | Craford | H01L 33/62 257/99 |
| 7,795,050 | B2* | 9/2010 | Song | C30B 25/18 257/103 |
| 7,825,422 | B2* | 11/2010 | Maeda | C04B 41/009 257/629 |
| 7,854,975 | B2* | 12/2010 | Fujii | C04B 35/645 219/444.1 |
| 7,932,107 | B2* | 4/2011 | Fujikura | C30B 25/183 117/84 |
| 8,007,922 | B2* | 8/2011 | Mirchandani | B22F 7/062 175/425 |
| 8,073,028 | B2* | 12/2011 | Yamaguchi | H01S 5/02208 359/197.1 |
| 8,097,548 | B2* | 1/2012 | Zhang | C04B 35/58078 501/92 |
| 8,187,901 | B2* | 5/2012 | Sheen | B28B 1/16 438/46 |
| 8,221,517 | B2* | 7/2012 | Mirchandani | C22C 29/00 75/246 |
| 8,323,796 | B2* | 12/2012 | Schmidt | C04B 35/56 428/408 |
| 8,337,032 | B2* | 12/2012 | Nagai | H01L 33/505 362/230 |
| 8,354,353 | B2* | 1/2013 | Abds-Sami | C04B 35/117 501/127 |
| 8,513,876 | B2* | 8/2013 | Shioi | C04B 35/597 313/503 |
| 8,673,794 | B1* | 3/2014 | Ramachandran | C04B 35/563 501/87 |
| 8,921,980 | B2* | 12/2014 | Amano | C30B 23/00 117/87 |
| 9,212,408 | B2* | 12/2015 | Satoh | C22C 5/02 |
| 9,279,178 | B2* | 3/2016 | Kardokus | C23C 14/3414 |
| 2003/0168664 | A1 | 9/2003 | Hahn et al. | |
| 2003/0173574 | A1 | 9/2003 | Koide et al. | |
| 2004/0033638 | A1 | 2/2004 | Bader et al. | |
| 2004/0072383 | A1 | 4/2004 | Nagahama et al. | |
| 2004/0097359 | A1* | 5/2004 | Hiramatsu | B32B 18/00 501/98.4 |
| 2004/0173807 | A1 | 9/2004 | Tian | C09K 11/7774 257/98 |
| 2005/0101105 | A1 | 5/2005 | Ghyselen et al. | |
| 2006/0255341 | A1 | 11/2006 | Pinnington et al. | |
| 2007/0072324 | A1 | 3/2007 | Krames et al. | |
| 2007/0267646 | A1* | 11/2007 | Wierer, Jr. | B82Y 20/00 257/98 |
| 2008/0039312 | A1* | 2/2008 | Natsuhara | C04B 35/581 501/153 |
| 2008/0296584 | A1* | 12/2008 | Hachigo | 257/76 |
| 2009/0117675 | A1 | 5/2009 | Yamanaka et al. | |
| 2009/0127567 | A1 | 5/2009 | Wang | |
| 2009/0321747 | A1 | 12/2009 | Murphy et al. | |
| 2010/0219419 | A1* | 9/2010 | Hata | B82Y 20/00 257/79 |
| 2010/0255338 | A1* | 10/2010 | Hayakawa | A44C 27/006 428/627 |
| 2011/0057165 | A1 | 3/2011 | Pinnington | |
| 2011/0148248 | A1* | 6/2011 | Landa | H01J 45/00 310/306 |

FOREIGN PATENT DOCUMENTS

| | | |
|---|---|---|
| CN | 1933202 A | 3/2007 |
| CN | 101315967 A | 12/2008 |
| JP | 2002124473 A | 4/2002 |
| JP | 2002134422 A | 5/2002 |
| JP | 2004512688 A | 4/2004 |
| JP | 2006054231 A | 2/2006 |
| JP | 2006324685 A | 11/2006 |
| KR | 20080078679 A | 8/2008 |
| KR | 20090004462 A | 1/2009 |
| TW | 554452 B | 9/2003 |
| TW | 200401460 A | 1/2004 |
| TW | 200807749 A | 2/2008 |
| TW | 200849678 A | 12/2008 |
| TW | 200933935 A | 8/2009 |
| WO | 2007071772 A1 | 6/2007 |

OTHER PUBLICATIONS

Kim et al., "Effects of Y2O3 additions on the densification and thermal conductivity of spark plasma sintering AlN ceramics", Journal of Ceramic Processing Research 10 (2009) pp. 109-112.*

International Search Report and Written Opinion dated Apr. 28, 2011 for International Application No. PCT/US2010/048333, 8 pages.

Atwater Jr., H.A., Ion Beam Enhanced Grain Growth in Thin Films, RLE Technical Report No. 527, Massachusetts Institute of Technology, Research Laboratory of Electronics, pp. 1-224, Mar. 1987.

Atwater, H.A. et al., Mechanisms for Crystallographic Orientation in the Crystallization of Thin Silicon Films from the Melt, J. Mater. Res., vol. 3, No. 6, pp. 1232-1237, Nov./Dec. 1988.

Atwater, H.A. et al., Zone-Melting Recrystallization of Thick Silicon on Insulator Films, Materials Letters, vol. 2, No. 4A, pp. 269-273, Mar. 1984.

Choi, J.-H. et al. Zone Melting Recrystallization of Polysilicon by a Focused-Lamp with Unsymmetric Trapezoidal Power Distribution, Journal of Electronic Materials, vol. 20, No. 3, pp. 231-235, Mar. 1991.

Colinge, J.-P., Silicon-on-Insulator Technology: Materials to VLSI, 2nd Edition, pp. 16-27 and 52-65, Sep. 1997.

Geis, M.W. et al., (Invited) Silicon Graphoepitaxy, Proceedings of the 12th Conference on Solid State Devices, Tokyo 1980, Japanese Journal of Applied Physics, vol. 20, Supplement 20-1, pp. 39-42, 1981.

Geis, M.W. et al., Grapho-Epitaxy of Silicon on Fused Silica using Surface Micropatterns and Laser Crystallization, J. Vac. Sci. Technol., vol. 16, No. 6, pp. 1640-1643, Nov./Dec. 1979.

Geis, M.W. et al., Summary Abstract: Silicon Graphoepitaxy, J. Vac. Sci. Technol., vol. 18, No. 2, pp. 229-230, Mar. 1981.

Geis, M.W. et al., Zone-Melting Recrystallization of Si Films with a Moveable-Strip-Heater Oven, J. Electrochem. Soc.: Solid State Science and Technology, vol. 129, No. 12, pp. 2812-2818, Dec. 1982.

Givargizov, E.I., Graphoepitaxy as an Approach to Oriented Crystallization on Amorphous Substrates, Journal of Crystal Growth, vol. 310, No. 7-9, pp. 1686-1690, Apr. 2008.

Klykov, V.I. et al. Artificial Epitaxy (Diataxy) of Silicon and Germanium, Acta Physica Academiae Scientiarum Hungaricae, vol. 47, Nos. 1-3, pp. 167-183, Mar. 1979.

Minagawa, Y. et al. Fabrication of (111)-Oriented Si Film with a Ni/Ti Layer by Metal Induced Crystallization, Jpn. J. Appl. Phys., vol. 20, Part 2, No. 3A, pp. L186-L188, Mar. 2001.

Moon, B.Y. et al. Study on the Polycrystalline Silicon Films Deposited by Inductively Coupled Plasma Chemical Vapor Deposition, Mat. Res. Soc. Symp. Proc., vol. 685E, pp. D5.2.1-D5.2.6, 2001.

Naomoto, H. et al., Characterization of Thin-Film Silicon Formed by High-Speed Zone-Melting Recrystallization Process, Solar Energy Materials and Solar Cells, vol. 48, Nos. 1-4, pp. 261-267, Nov. 1997.

Pauli, M. et al., Large Area and Rapid Thermal Zone Melting Crystallization of Silicon Films on Graphite Substrates for Photovoltaic

(56) References Cited

OTHER PUBLICATIONS

Use, Conference Record of the 23rd IEEE Photovoltaic Specialists Conference, pp. 195-200, May 1993.
Scharff, W. et al., Flash-Lamp-Induced Crystal Growth of Silicon on Amorphous Substrates Using Artificial Surface-Relief Structures, Physica Status Solidi (a), vol. 74, No. 2, pp. 545-552, Dec. 1982.
Wan, J. et al., Growth of Crack-Free Hexagonal GaN Films on Si(100), Applied Physics Letters, vol. 79, No. 10, pp. 1459-1461, Sep. 2001.
Yoon, S.M. et al., Numerical Simulation of Scanning Speed and Supercooling Effects During Zone-Melting-Recrystallization of SOI Wafers, Mat. Res. Soc. Symp. Proc., vol. 205, pp. 453-458, 1990.
Office Action dated Mar. 15, 2013 in Republic of Korea Application No. 10-2012-7003203, 21 pages.
Office Action dated Jan. 6, 2014 in Chinese Application No. 201080040476.8, 9 pages.
Office Action dated Jun. 24, 2014 in Taiwan Patent Application No. 099130810, 23 pages.

\* cited by examiner

EPITAXIAL FORMATION STRUCTURES AND ASSOCIATED METHODS OF MANUFACTURING SOLID STATE LIGHTING DEVICES

CROSS-REFERENCE TO RELATED APPLICATIONS

The present application is a divisional of U.S. application Ser. No. 12/878,815 filed Sep. 9, 2010, now U.S. Pat. No. 8,580,593 which claims priority to U.S. Provisional Application No. 61/241,233 filed on Sep. 10, 2009, each of which is incorporated herein by reference.

TECHNICAL FIELD

The present disclosure is related to epitaxial formation structures and associated methods of manufacturing solid state lighting ("SSL") devices with target thermal expansion characteristics.

BACKGROUND

SSL devices generally use semiconductor light emitting diodes ("LEDs"), organic light emitting diodes ("OLED"), and/or polymer light emitting diodes ("PLED") as sources of illumination rather than electrical filaments, a plasma, or a gas. For example, FIG. 1 is a cross-sectional diagram of a conventional indium-gallium nitride (InGaN) LED 10. As shown in FIG. 1, the LED 10 includes a substrate material 12 (e.g., silicon), N-type gallium nitride (GaN) 14, GaN/InGaN multiple quantum wells ("MQWs") 16, and P-type GaN 18. The LED 10 also includes a first contact 20 on the P-type GaN 18 and a second contact 22 on the N-type GaN 14. During manufacturing, the N-type GaN 14, the GaN/InGaN MQWs 16, and the P-type GaN 18 are formed on the substrate material 12 via metal organic chemical vapor deposition ("MOCVD"), molecular beam epitaxy ("MBE"), liquid phase epitaxy ("LPE"), hydride vapor phase epitaxy ("HVPE"), and/or other epitaxial growth techniques typically at elevated temperatures.

One operational difficulty of forming the LED 10 is that the N-type GaN 14, the GaN/InGaN MQWs 16, and the P-type GaN 18 may be delaminated from the substrate material 12 and/or otherwise damaged during high-temperature epitaxial growth and/or cool-down thereafter. Typically, the substrate material 12 includes silicon (Si), sapphire ($Al_2O_3$), silicon carbide (SiC), and/or other "non-native" materials because "native" materials (e.g., GaN or InGaN) with usable dimensions are difficult to produce. The non-native substrate materials have different CTEs than the GaN/InGaN materials 14, 16, and 18. For example, the CTE of silicon is substantially smaller than that of GaN, and the CTE of sapphire is substantially higher than that of GaN. It is believed that such CTE mismatches may result in thermal stress causing warpage in the substrate material 12 and/or crystal defects in epitaxial GaN/InGaN materials 14, 16, and 18. Accordingly, several improvements in reliably and cost-effectively manufacturing SSL devices may be desirable.

DETAILED DESCRIPTION

Various embodiments of epitaxial formation structures and associated methods of manufacturing SSL devices with target thermal expansion characteristics are described below. As used hereinafter, the term "SSL device" generally refers to devices with LEDs, OLEDs, laser diodes ("LDs"), PLEDs, and/or other suitable sources of illumination other than electrical filaments, a plasma, or a gas. A person skilled in the relevant art will also understand that the technology may have additional embodiments, and that the technology may be practiced without several of the details of the embodiments described below with reference to FIGS. 2A-6.

FIGS. 2A-2F are cross-sectional views of a composite structure 100 with a target CTE undergoing a process for forming an SSL device in accordance with embodiments of the technology. Even though only certain processing stages are illustrated in FIGS. 2A-2F, the process for forming the SSL device can also include other stages for forming a lens, a mirror, a carrier structure, conductive interconnects, electrical contacts, and/or other suitable mechanical/electrical components (not shown).

Figure 1:
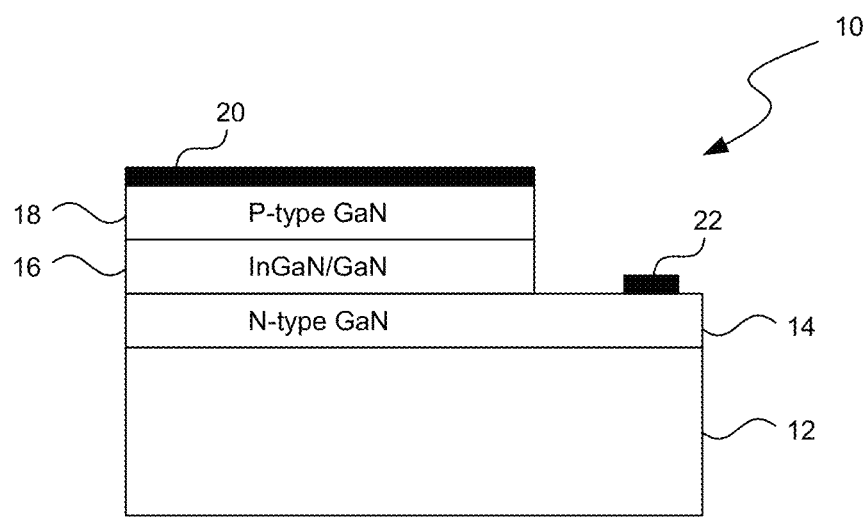
FIG. 1 is a schematic cross-sectional diagram of an LED device in accordance with the prior art.
Figure 2A:
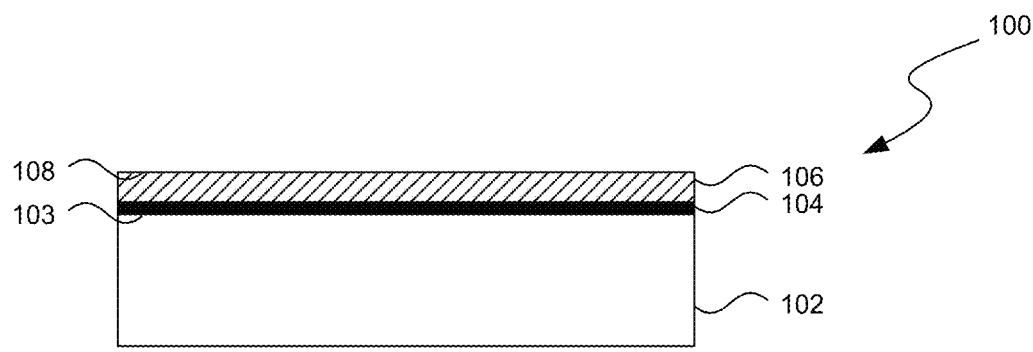
FIGS. 2A-2F are cross-sectional views of a composite structure with a target CTE undergoing a process for forming an SSL device in accordance with embodiments of the technology.

As shown in FIG. 2A, an initial operation of the process includes forming the composite structure 100. In the illustrated embodiment, the composite structure 100 includes a composite material 102, a diffusion barrier 104, and an insulation material 106. In other embodiments, the diffusion barrier 104 and/or the insulation material 106 may be omitted from the composite structure 100. In further embodiments, the composite structure 100 may also include a conductive material, a carrier material, and/or other suitable components in addition to or in lieu of the foregoing components of the composite structure 100.

In FIG. 2A, the diffusion barrier 104 and the insulation material 106 are attached to a top surface 103 of the composite material 102 in series. Optionally, in other embodiments, the diffusion barrier 104 can at least partially encapsulate the composite material 102. In further embodiments, the insulation material 106 can be attached to side and/or other surfaces of the diffusion barrier 104 and can at least partially encapsulate the diffusion barrier 104. In further embodiments, the diffusion barrier 104 is not attached to all surfaces of the composite material 102. However, the insulation material 106 can be attached to all surfaces of the diffusion barrier 104 and to any surfaces of the composite material 102 not covered by the diffusion barrier 104.

The diffusion barrier 104 can include tantalum nitride (TaN), indium oxide ($In_2O_3$), copper silicide ($Cu_5Si$), tungsten nitride ($WN_2$), titanium nitride (TiN), silicon nitride ($Si_3N_4$), amorphous or polycrystalline silicon carbide (SiC), amorphous or polycrystalline silicon (Si), and/or other suitable diffusion resistant materials. The insulation material 106 can include silicon dioxide ($SiO_2$), silicon carbide (SiC), silicon nitride ($Si_3N_4$), amorphous or polycrystalline silicon (Si), and/or other suitable insulation materials. In the illustrated embodiment, the insulation material 106 includes a generally planar surface 108. Techniques for polishing the insulation material 106 can include chemical-mechanical polishing ("CMP"), electrochemical-mechanical polishing ("ECMP"), and/or other suitable planarizing techniques. In other embodiments, the insulation material 106 may include a non-planar surface (not shown). In further embodiments, the diffusion barrier 104 and/or the insulation material 106 can include a material (e.g., silicon nitride) that is non-stoichiometric (e.g., as silicon-rich).

The composite material 102 can include a base material and at least one CTE control material that together have a CTE temperature dependency that is adjusted based on CTE values of the SSL device and/or other suitable operating parameters for forming and/or subsequently processing the SSL device. As used herein, the term "CTE temperature dependency" generally refers to a profile of CTE values as a function of temperature. In certain embodiments, the base material can include polycrystalline aluminum nitride (AlN) and/or polycrystalline silicon carbide (SiC). In other embodiments, the base material can include tungsten (W), molybdenum (Mo), and/or other suitable refractory metals. In further embodiments, the base material can include other suitable single crystalline, polycrystalline, amorphous materials, or a combination thereof.

The CTE control material can have a CTE value either higher or lower than that of the base material in a target temperature range. In certain embodiments, the CTE control material can include a single material selected from silicon nitride ($Si_3N_4$), titanium nitride (TiN), zirconium nitride (ZrN), hafnium nitride (HfN), silicon oxide ($SiO_2$), aluminum oxide ($Al_2O_3$), aluminum oxynitride (AlON), titanium carbide (TiC), zirconium carbide (ZrC), hafnium carbide (HfC), silicon carbide (SiC), yttrium oxide ($Y_2O_3$), and other suitable materials. For example, the composite material 102 can include AlN and $Y_2O_3$.

In other embodiments, the CTE control material can include at least two of the foregoing materials and/or other suitable materials. For example, the composite material 102 can include:

AlN, $Y_2O_3$, and $Al_2O_3$;
AlN, $Y_2O_3$, and TiN;
AlN, $Y_2O_3$, and ZrN;
AlN, $Y_2O_3$, and HfN; or
AlN, $Y_2O_3$, and HfC.

In further examples, the composite material 102 may include three, four, or any other number and/or combinations of suitable CTE control materials.

The base material and the CTE control material may be combined using isostatic pressing, tape-casting, sintering, and/or a combination of these and/or other suitable techniques. For example, in one embodiment, powders of the base material (e.g., containing AlN) and the CTE control material (e.g., containing $Y_2O_3$) may be combined to form an aqueous slurry with a target volume (or weight) ratio. The slurry can then be cast into a tape using tape-casting. The tape can subsequently be sintered at a temperature of about 1800° C. to form the composite material 102. In other embodiments, the composite material 102 may be formed using other suitable techniques.

Figure 2B:
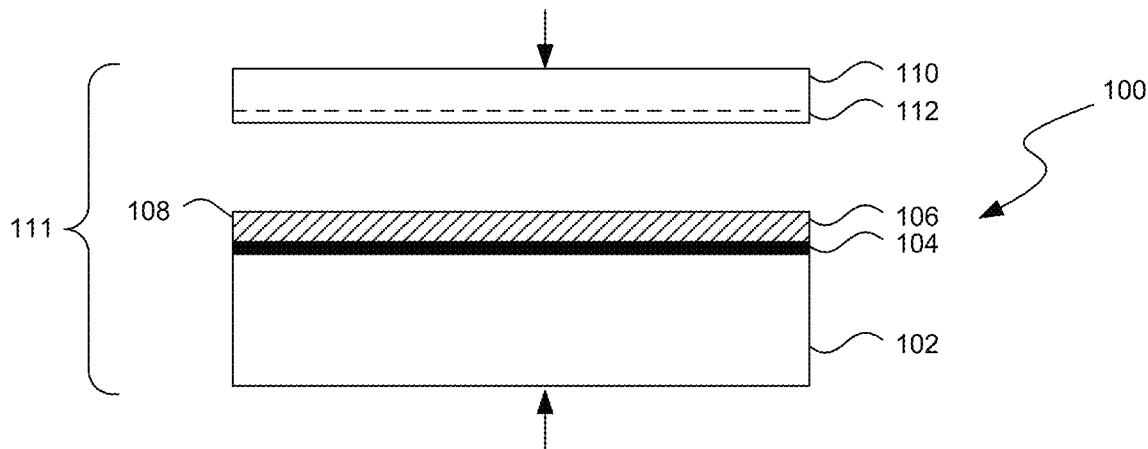

FIG. 2B shows another operation of the process in which a formation structure 110 is attached to the composite structure 100 to form a template structure 111. In certain embodiments, the formation structure 110 can include silicon (Si), at least a portion of which has the Si(1,1,1) crystal orientation. In other embodiments, the formation structure 110 can include silicon with other crystal orientations (e.g., Si(1,0,0)), aluminum gallium nitride (AlGaN), GaN, SiC, $Al_2O_3$, zinc oxide ($ZnO_2$), gallium arsenide (GaAs), a combination of the foregoing materials and/or other suitable materials. In the illustrated embodiment, the formation structure 110 includes a bonding region 112 proximate the surface 108 of the insulation material 106. The bonding region 112 may be doped with an exfoliation agent (e.g., hydrogen (H or $H_2$), boron (B), helium (He), or any combination thereof) using ion implantation and/or other suitable techniques. In other embodiments, the bonding region 112 may be omitted.

In certain embodiments, the formation structure 110 may be attached to the surface 108 of the insulation material 106 using solid-solid bonding techniques. For example, the formation structure 110 and the composite structure 100 may be mechanically pressed against each other while being heated to a bonding temperature (e.g., 300° C.). It is believed that the formation structure 110 and the composite structure 100 can bond with each other under such conditions via chemical bonding, van der Waals interactions, hydrogen bonds, and/or other suitable mechanisms. In other embodiments, the formation structure 110 and the composite structure 100 may be attached using an adhesive material (not shown) and/or other suitable techniques.

Figure 2C:
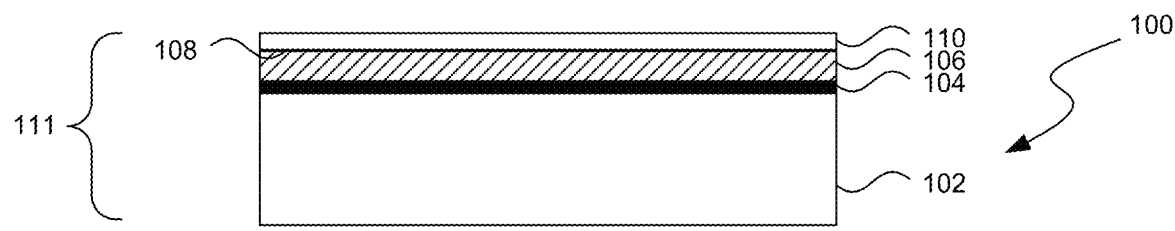

FIG. 2C shows another operation of the process in which a portion of the formation structure 110 is removed from the template structure 111. The remaining formation structure 110 can have a thickness of about 10 nanometers to about 2 micrometers, or can have other suitable thickness values such that the CTE temperature dependency of the template structure 111 generally corresponds to that of the composite structure 100. In one embodiment, the portion of the formation structure 110 can be removed through exfoliation of the dopant (e.g., hydrogen (H or $H_2$), boron (B), or helium (He), or any combination thereof) at a temperature of about 250° C. for hydrogen and boron compounds, and about 400° C. for hydrogen or hydrogen and helium compounds. In other embodiments, the portion of the formation structure 110 may be removed using CMP, ECMP, dry etching, wet etching, and/or other suitable material removal techniques.

Figure 2D:
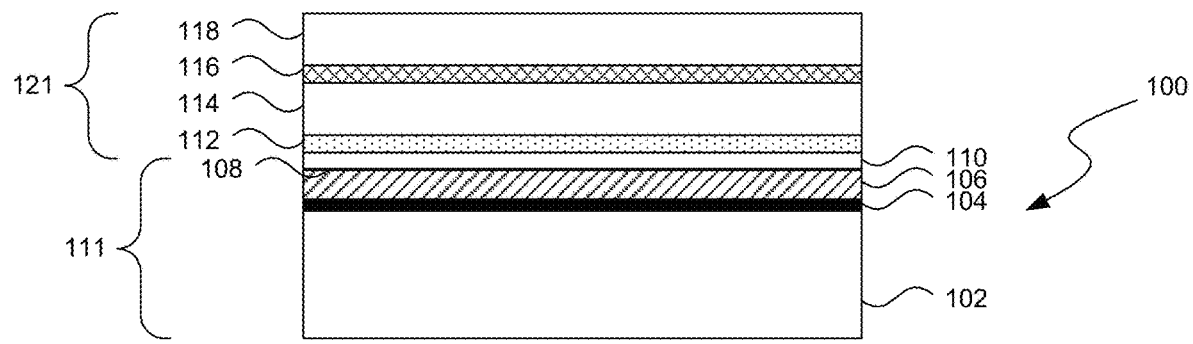

FIG. 2D shows another operation of the process in which an SSL structure 121 is formed on the formation structure 110. In the illustrated embodiment, the SSL structure 121 includes an optional buffer material 112, a first semiconductor material 114, an active region 116, and a second semiconductor material 118 formed via MOCVD, MBE, LPE, HVPE, and/or other suitable epitaxial growth techniques. In other embodiments, the SSL structure 121 can also include other suitable components.

The optional buffer material 112 can facilitate the formation of the first and second semiconductor materials 114 and 118 and the active region 114 on the formation structure 110. In certain embodiments, the optional buffer material 112 can include at least one of aluminum nitride (AlN), AlGaN, zinc nitride (ZnN), GaN, and/or other suitable materials. In other embodiments, the optional buffer material 112 may be omitted, and the first semiconductor material 114 may be formed directly on the formation structure 120.

In certain embodiments, the first semiconductor material 114 can include N-type GaN (e.g., doped with silicon (Si)), and the second semiconductor material 118 can include P-type GaN (e.g., doped with magnesium (Mg)). In other embodiments, the first semiconductor material 114 can include P-type GaN, and the second semiconductor material 118 can include N-type GaN. In further embodiments, the first and second semiconductor materials 114 and 118 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials.

The active region 116 can include a single quantum well ("SQW"), MQWs, and/or a bulk semiconductor material. As used hereinafter, a "bulk semiconductor material" generally refers to a single grain semiconductor material (e.g., InGaN) with a thickness greater than about 10 nanometers and up to about 5 micrometers. In certain embodiments, the active region 116 can include an InGaN SQW, GaN/InGaN MQWs, and/or an InGaN bulk material. In other embodiments, the active region 116 can include aluminum gallium indium phosphide (AlGaInP), aluminum gallium indium nitride (AlGaInN), and/or other suitable materials or configurations.

The optional buffer material 112, the first and second semiconductor materials 114 and 118, and the active region 116 can have lower thermal stress when formed on the template structure 111 by selecting the base material and/or the CTE control material so that the composite structure 100 has a CTE value that at least approximates that of one or more components of the SSL structure 121. However, it has been realized that the CTE values of both the SSL structure 121 and the composite structure 100 are temperature dependent. Thus, the CTE values of the SSL structure 121 and the composite structure 100 may deviate significantly from each other at certain temperatures (e.g., during cool-down) even though they approximate each other at other temperatures (e.g., during epitaxial growth). Various embodiments of selecting the base material and/or the CTE control material to accommodate the CTE temperature dependency of the SSL structure 121 are discussed in more detail below with reference to FIG. 3.

Figure 2E:
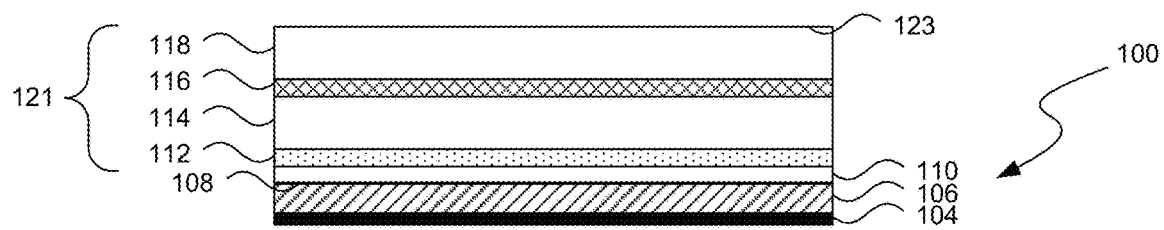

FIG. 2E shows another operation of the process in which the composite structure 100 is removed from the SSL structure 121. In one embodiment, removing the composite structure 100 can include contacting the composite structure 100 containing polycrystalline AlN with potassium hydroxide (KOH) at a temperature of about 100° C. It has been observed that KOH can react with polycrystalline AlN in the composite structure 100 until the diffusion barrier 104 containing $Si_3N_4$ is exposed. As a result, the diffusion barrier 104 also functions as an etch stop. In other embodiments, the composite structure 100 can be removed using CMP, ECMP, and/or other suitable removal techniques.

Optionally, in certain embodiments, a surface 123 of the SSL structure 121 may be attached to a carrier substrate (not shown) prior to removing the composite structure 100. The carrier substrate can be constructed from silicon (Si), copper (Cu), copper tungsten alloys (Cu—W), molybdenum (Mo), and/or other materials with suitable thermal and electrical properties. The SSL structure 121 may be attached to the carrier substrate through eutectic bonding, metal to metal bonding (e.g., copper to copper bonding), conductive adhesives, and/or other suitable mechanisms.

Figure 2F:
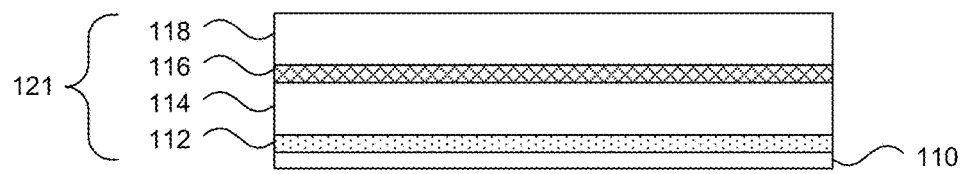

FIG. 2F shows another operation of the process in which the diffusion barrier 104 and the insulation material 106 are removed from the SSL structure 121 via CMP, ECMP, dry etching, wet etching, and/or other suitable removal techniques. In the illustrated embodiment, the formation structure 110 and the optional buffer material 112 remain attached to the SSL structure 121. In other embodiments, the formation structure 110, the optional buffer material 112, and a portion of the first semiconductor material 114 can also be removed from the SSL structure 121.

Figure 3:
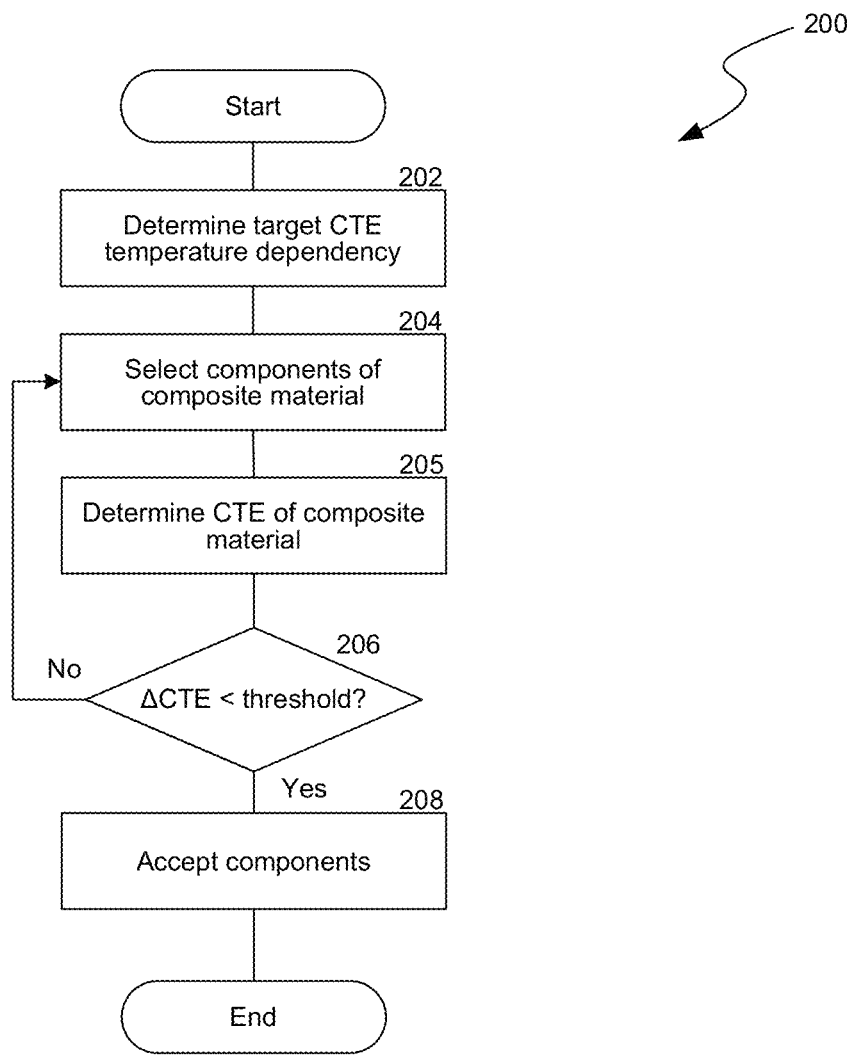
FIG. 3 is a flowchart illustrating a method of selecting components for the composite structure in FIGS. 2A-2F.

FIG. 3 is a flowchart illustrating a method 200 for selecting components for the composite material 102 in FIGS. 2A-2F. The composite material 102 with the selected components can have a CTE temperature dependency that is adjusted for thermal processing associated with attaching the formation structure 110 to the composite structure 100, growing the SSL structure 121 (FIG. 2D) on the formation structure 110, cooling down, and/or other suitable processing operations.

As shown in FIG. 3, an initial stage (block 202) of the method 200 includes determining a target CTE temperature dependency. In one embodiment, the target CTE temperature dependency may be determined based on the CTE temperature dependency of the SSL structure 121. For example, the target CTE temperature dependency may be approximated as that of GaN/InGaN and/or other semiconductor materials used for forming the SSL structure 121 (FIG. 2D). In other embodiments, the target CTE temperature dependency may be calculated based on the CTE temperature dependency of various components of the SSL structure 121 and their respective dopant levels and elastic modulus. In further embodiments, the target CTE temperature dependency may be determined empirically by measuring that of the SSL structure 121. In yet further embodiments, the target CTE temperature dependency may be determined based on other suitable parameters.

In certain embodiments, the target CTE temperature dependency may be represented as an averaged and/or otherwise correlated value in a temperature range. For example, in certain embodiments, the target CTE temperature dependency may be an averaged value from room temperature (e.g., about 25° C.) to an epitaxial growth temperature (approximately 1100° C.). In other embodiments, the target CTE temperature dependency may be an averaged value over a temperature range (e.g., between about 800° C. and about 1100° C.) suitable for growing various components of the SSL structure 121. In further embodiments, the target CTE temperature dependency may be represented as a continuous function of temperature.

Another stage (block 204) of the method 200 includes selecting components of the composite material 102 (FIG. 2A) based on the target CTE temperature dependency. In one embodiment, selecting components of the composite material 102 includes selecting at least one of a composition and a volume (or weight) ratio of the base material and the CTE control material. For example, polycrystalline AlN may be selected as the base material, and the composition and/or volume ratio of the CTE control material (e.g., $Y_2O_3$) may be selected to increase an overall CTE value of the composite material 102 in a particular temperature range. In other embodiments, selecting components of the composite material 102 can also include selecting other suitable parameters for the composite material 102.

Figure 4:
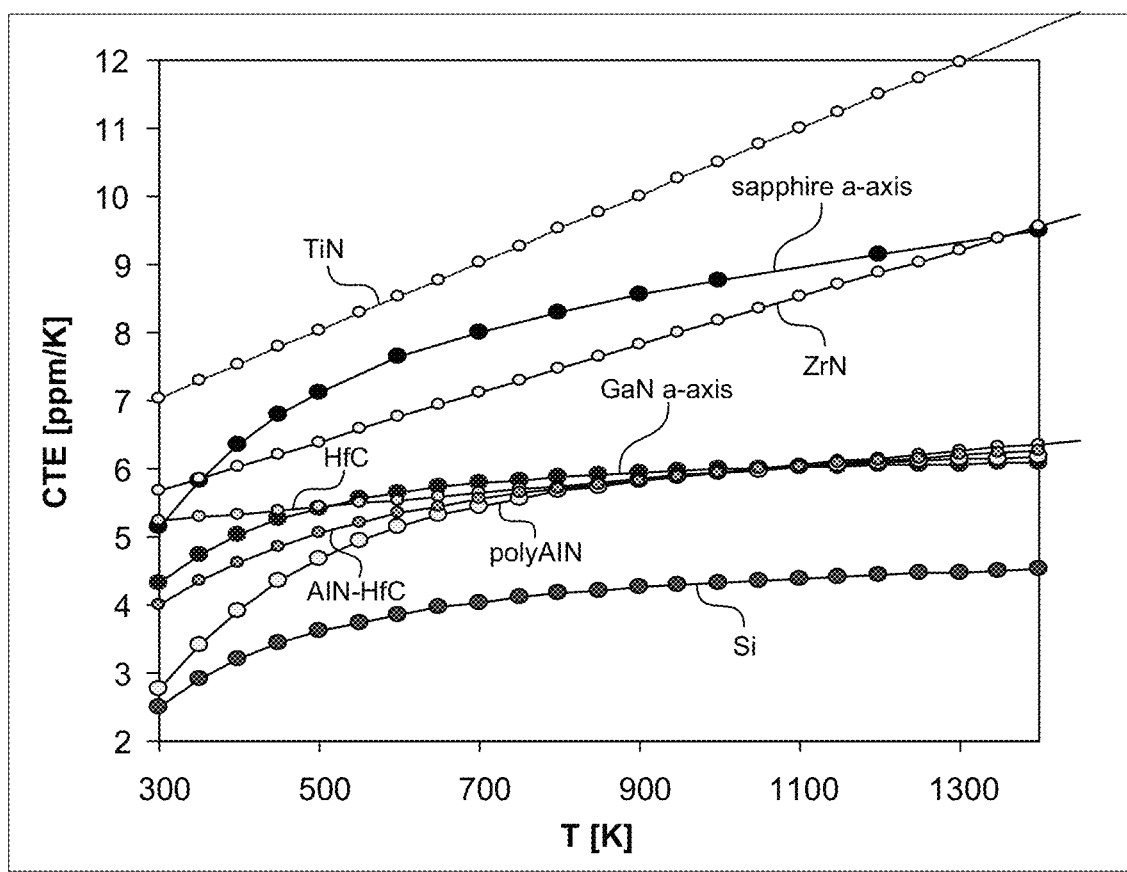
FIG. 4 is a graph showing CTE versus temperature for various materials useful for forming the SSL device in FIGS. 2A-2F.

In any of the foregoing embodiments, the CTE control material may be selected based on a CTE difference (ΔCTE) between the target CTE temperature dependency and the CTE temperature dependency of the CTE control material. As shown in FIG. 4, different materials (e.g., Si, polycrystalline AlN, TiN, HfC, GaN, sapphire, ZrN, and AlN—HfC) have different CTE temperature dependencies. For example, ZrN has a CTE that increases faster than that of GaN as temperature increases. As a result, the CTE difference ΔCTE between ZrN and GaN may increase as temperature increases. Thus, ZrN may not be suitable if the target CTE temperature dependency is that of GaN over a large temperature range. However, ZrN may be selected if the target CTE temperature dependency also increases at approximately the same rate as that of ZrN over a target temperature range. On the other hand, HfC has a CTE that is relatively stable over the temperature range from about 300K to about 1300K. Thus, HfC may be selected over a wide temperature range if the target temperature dependency is also relatively stable. As a result, in certain embodiments, the CTE control material may be selected by matching its CTE temperature dependency to the target CTE temperature dependency. In other embodiments, the CTE control material may be selected if its CTE temperature dependency at least approximates the target CTE temperature dependency.

Referring back to FIG. 3, in certain embodiments, at least two CTE control materials may be selected based on their respective CTE temperature dependencies in different temperature ranges. For example, a first CTE control material (e.g., $Y_2O_3$, or TiN) may be selected to increase the overall CTE value of the composite material 102 over a first temperature range (e.g., about 25° C. to about 1100° C.). A second CTE control material (e.g., HfC) may be selected to increase the overall CTE value of the composite material 102 over a second temperature range (e.g., about 25° C. to about 500° C.).

Using more than one CTE control material can accommodate CTE differences between the SSL structure 121 and the composite structure 100 in more than one temperature ranges. For example, it is believed that the CTE difference between polycrystalline AlN and GaN/InGaN is large enough to induce tensile stress in the GaN/InGaN during cool-down, but the CTE difference is relatively small (e.g., <0.3 ppm/° C.) during epitaxial growth at temperatures between 800° C. and 1100° C. Thus, by selecting a CTE control material (e.g., HfC) having a CTE value that modifies that of polycrystalline AlN more at low temperatures than at high temperatures, the low CTE difference at growth temperatures may be maintained while thermal stress during cool-down is reduced. In other embodiments, more than two CTE control materials may be used.

Another stage (block 205) of the method 200 includes determining the overall CTE temperature dependency of the composite material 102 based on the selected base material and the at least one CTE control material. In one embodiment, the overall CTE temperature dependency of the composite material 102 may be calculated based on the selected compositions, weight (or volume) ratio, respective elastic modulus, and the CTE temperature dependencies of each components. In another embodiment, the overall CTE temperature dependency of the composite material 102 may be determined empirically. In further embodiments, a combination of the foregoing techniques may be used to determine the overall CTE temperature dependency of the composite material 102.

Another stage (block 206) compares the CTE temperature dependency of the SSL structure 121 to that of the composite material 102 and determines whether the CTE difference is below a target threshold. The target threshold may be about 0.3 ppm/° C., 0.2 ppm/° C., 0.1 ppm/° C., and/or other suitable values. The target threshold of the CTE difference may be determined based on a thermal stress threshold during thermal processing associated with attaching the formation structure 110, growing the SSL structure 121, and/or other suitable processing operations. For example, in one embodiment, the thermal stress threshold may be set to less than about 100 MPa, less than about 200 MPa, less than about 300 MPa, or less than about other suitable values. Based on the thermal stress threshold, the target threshold for the CTE difference may be determined empirically and/or via other techniques.

In one embodiment, the CTE difference is calculated based on an averaged CTE value of both the SSL structure 121 and the composite material 102 over a target temperature range. If the CTE difference is greater than or equal to the target threshold, the process reverts to selecting different and/or additional components for the composite material 102 at block 204. If the CTE difference is less than the target threshold, the process proceeds to indicating that the selected components are acceptable (block 208).

In other embodiments, the CTE difference may be calculated as a function of temperature over a target temperature range. If the CTE difference is greater than or equal to the threshold at any temperature in the target temperature range, the process reverts to selecting components of the composite material 102 at block 204. If the CTE difference is less than the target threshold over the entire target temperature range, the process proceeds to indicating that the selected components are acceptable (block 208).

In further embodiments, the CTE difference may be integrated over a target temperature range as follows:

$$|\Delta CTE| = \frac{1}{(T_2 - T_1)} \int_{T_1}^{T_2} \Delta CTE(T) dT$$

where T is temperature; T1 is a low temperature limit; and T2 is a high temperature limit of the target temperature range. If the integrated CTE difference $|\Delta CTE|$ is greater than or equal to the threshold, the process reverts to selecting components of the composite material 102 at block 204; otherwise, the process proceeds to indicating that the selected components are acceptable (block 208).

Figure 5:
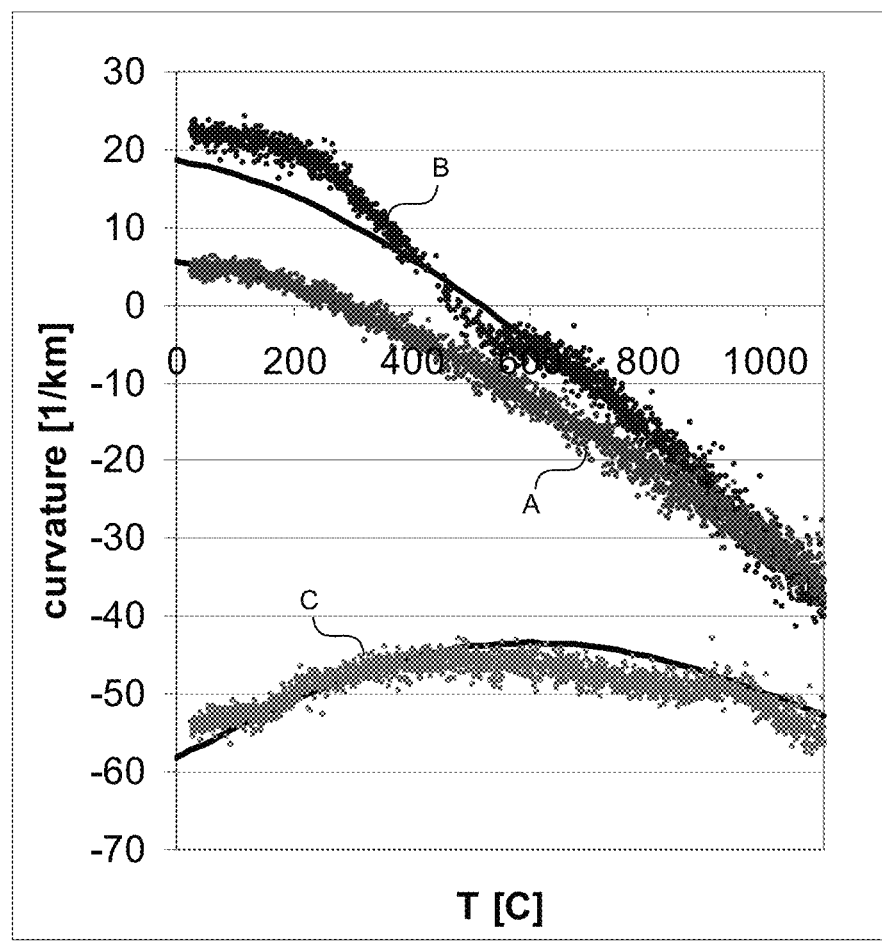
FIG. 5 is a graph showing temperature dependencies of curvature of various structures.

Experiments have been conducted to measure a temperature dependency of curvature of a GaN film deposited on a composite structure, as shown in FIG. 5. This measurement was performed using a laser deflection apparatus. Curve A is the measured temperature dependence of curvature for a composite structure having (1) polycrystalline AlN with a $Y_2O_3$ content of about 1%, and (2) a silicon dioxide insulation material. Curve B is the temperature dependence of curvature for the composite structure with a layer of silicon formed thereon.

Also shown for each curve are simulated temperature dependencies for the same structures (solid black lines). In order to obtain these curves, literature values for the elastic modulus and temperature dependencies of CTE of Si, $SiO_2$, and polycrystalline AlN were used. No fitting parameters were used to match the temperature dependencies of the measured data. However the initial curvature values (at 25° C.) were adjusted to account for initial stress and warpage of the starting materials. As shown in FIG. 5, there appears to be excellent agreement between the measured data of temperature dependency of curvature and the simulated data. A GaN film (with a thickness of about 3.5 micrometers) was formed onto the composite structure using MOCVD. A temperature dependency of curvature for the composite structure with the formed GaN firm was measured, and the data are shown in Curve C.

Figure 6:
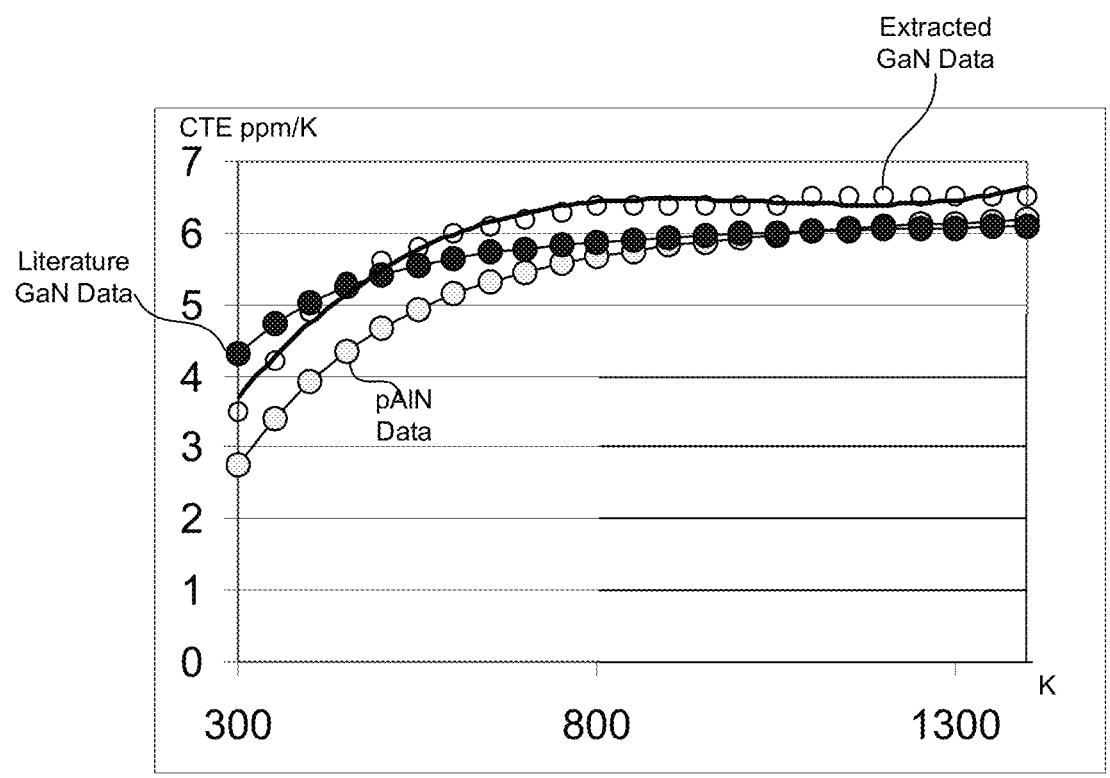
FIG. 6 is a graph showing literature values and extracted values of CTE temperature dependencies of GaN and polycrystalline AlN.

Using the measured data, an effective CTE temperature dependency of the deposited GaN film was extracted. The extracted CTE temperature dependency is shown in FIG. 6 (identified as "Extracted GaN Data") along with literature data for polycrystalline AlN as a reference (identified as "pAlN Data"). As shown in FIG. 6, the extracted CTE temperature dependency deviate from literature values for a-axis GaN (identified as "Literature GaN Data").

Based on the foregoing experimental results, it is believed that in order to reduce the thermal stress associated with epitaxial growth, cool-down after epitaxial growth and/or other processing operations, the CTE of the polycrystalline AlN may be increased over the temperature range from room temperature to growth temperature (about 25° C. to about 1100° C.) by adding CTE control material(s) having CTE values higher than GaN. Examples of such materials included $Y_2O_3$, $Al_2O_3$, $TiC_xN_{(1-x)}$, $ZrC_xN_{(1-x)}$, and/or $HfC_xN_{(1-x)}$.

Following examples of material combinations are believed to be suitable for forming a composite material that when used as a composite substrate, resulted in less than 100 MPa of thermally induced stress at 25° C. in GaN grown at between 600° C. and 1100° C.:

1. $AlN(x):Y_2O_3(1-x)$, $0.75<x<0.95$
2. $AlN(x):Y_2O_3(y):Al_2O_3(1-x-y)$, $0.75<x<0.9$ and $0.01<y<0.2$
3. $AlN(x):Y_2O_3(y):TiN(1-x-y)$
4. $AlN(x):Y_2O_3(y):ZrN(1-x-y)$
5. $AlN(x):Y_2O_3(y):HfN(1-x-y)$
6. $AlN(x):Y_2O_3(y):HfC(1-x-y)$, $0.4<x<0.7$ and $0.01<y<0.2$ From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

I claim:

1. An integrated semiconductor device assembly for use in forming a solid state lighting (SSL) device, the assembly comprising:

a substrate comprising a composite ceramic material, the composite ceramic material having a composite coefficient of thermal expansion (CTE) temperature dependency over a temperature range from 800° C. to 1100° C.;

a formation structure on the substrate, the formation structure comprising at least one of Si(1,1,1) silicon, gallium nitride (GaN), silicon carbide (SiC), sapphire ($Al_2O_3$), zinc oxide ($ZnO_2$), or gallium arsenide (GaAs); and an SSL structure on the formation structure, the SSL structure having an SSL CTE temperature dependency over the temperature range, the SSL structure comprising a first semiconductor material including P-type gallium nitride, a second semiconductor material including N-type gallium nitride, and an active region, between the first and second semiconductor materials, comprising indium gallium nitride, wherein a difference between the composite CTE and SSL CTE temperature dependencies is below a target threshold of 0.3 ppm/° C. over the temperature range, and wherein the composite ceramic material comprises polycrystalline aluminum nitride (AlN), yttrium oxide ($Y_2O_3$) and hafnium carbide (HfC) sintered together.

2. The assembly of claim 1 wherein the target threshold is below 0.1 ppm/° C.

3. The assembly of claim 1 wherein:

the polycrystalline aluminum nitride comprises 0.4 to 0.7 by volume of the composite ceramic material, and the yttrium oxide comprises 0.01 to 0.2 by volume of the composite ceramic material.

* * * * *